(12) United States Patent
Iha et al.

(10) Patent No.: US 6,885,276 B2
(45) Date of Patent: Apr. 26, 2005

(54) PHOTOSENSITIVE THICK FILM COMPOSITION AND ELECTRONIC DEVICE USING THE SAME

(75) Inventors: Michiaki Iha, Kusatsu (JP); Masahiro Kubota, Yasu-gun (JP); Shizuharu Watanabe, Omihachiman (JP)

(73) Assignee: Murata Manufacturing Co., Ltd., Kyoto-fu (JP)

(*) Notice: Subject to any disclaimer, the term of this patent is extended or adjusted under 35 U.S.C. 154(b) by 569 days.

(21) Appl. No.: 09/801,453

(22) Filed: Mar. 8, 2001

(65) Prior Publication Data

US 2001/0033219 A1 Oct. 25, 2001

(30) Foreign Application Priority Data

Mar. 15, 2000 (JP) .................................... 2000-072755
Mar. 15, 2000 (JP) .................................... 2000-072756

(51) Int. Cl.[7] ................................................ H01F 5/00
(52) U.S. Cl. .................................................... 336/200
(58) Field of Search .......................... 336/83, 200, 232, 336/233; 428/210; 252/510–515, 518.1–521

(56) References Cited

U.S. PATENT DOCUMENTS 4,379,857 A * 4/1983 Hansen et al. ................ 521/54
5,393,604 A * 2/1995 Sanchez ...................... 428/325

FOREIGN PATENT DOCUMENTS

| EP | 0768339 A2 | 4/1997 |
|---|---|---|
| GB | 2348206 A | 9/2000 |
| JP | 5-206600 | 8/1993 |
| JP | 6-69374 | 3/1994 |
| JP | 6-224538 | 8/1994 |
| JP | 6-283846 | 10/1994 |
| JP | 7-135386 | 5/1995 |
| JP | 8-33757 | 12/1996 |
| JP | 9-218508 | 8/1997 |
| JP | 9-218509 | 8/1997 |
| JP | 9-222723 | 8/1997 |
| JP | 9-230587 | 9/1997 |
| JP | 9-304923 | 11/1997 |
| JP | 10-171107 | 6/1998 |
| JP | 11-84646 | 3/1999 |
| JP | 11-194493 | 7/1999 |
| JP | 11-317112 | 11/1999 |
| JP | 2000-44640 | 2/2000 |
| JP | 2000-90738 | 3/2000 |
| JP | 2000-221671 | 8/2000 |
| JP | 2000-330277 | 11/2000 |
| JP | 3394938 | 1/2003 |

OTHER PUBLICATIONS

WPI Abstract AN 1997–24771 [22] & JP 9077815 A (Nippon Kayaku) See Abstract.
WPI Abstract An 1993–383109 [48] & JP 5287036 A (Nippon Kayaku) See Abstract.

* cited by examiner

*Primary Examiner*—Tuyen T. Nguyen
(74) *Attorney, Agent, or Firm*—Dickstein, Shapiro, Morin & Oshinsky, LLP

(57) ABSTRACT

A photosensitive thick film composition is provided which has superior storage stabilities and can be reliably processed by developing. The photosensitive thick film composition is composed of a photosensitive organic component containing an organic binder having an acidic functional group, such as a carboxyl group, an inorganic component containing a polyvalent metal oxide, such as borosilicate glass, and an alcohol having a plurality of hydroxyl group, such as glucitol.

20 Claims, 2 Drawing Sheets

PHOTOSENSITIVE THICK FILM COMPOSITION AND ELECTRONIC DEVICE USING THE SAME

BACKGROUND OF THE INVENTION

1. Field of the Invention

The present invention relates to photosensitive thick film compositions to be patterned by a photolithography method and to electronic devices formed by using the photosensitive thick film composition, and more particularly, relates to a photosensitive thick film composition comprising a photosensitive organic component containing an organic binder having an acidic functional group and an inorganic component containing a multivalent metal compound.

2. Description of the Related Art

Recently, the performance of various electronic apparatuses, such as mobile information terminals, and computers, have significantly improved, and in particular, greater information processing and the miniaturization of electronic apparatuses have accelerated. In addition, miniaturization and higher densities in electronic devices, which have been primarily responsible for improvements in electronic apparatuses, are also required, and three-dimensional conductive patterns for electronic devices are progressing.

In laminated electronic devices having three-dimensional conductive patterns therein, via holes are generally provided so that the conductive patterns which are disposed between a plurality of insulating layers are connected three-dimensionally with each other.

In laminated electronic devices formed by so-called thick film printing, via holes are formed by steps of (1) preparing an insulating paste by mixing powdered glass with an organic vehicle, (2) printing the insulating paste on a substrate so as to form a coating film having holes therein used as via holes, (3) filling a conductive paste in the holes used as via holes, and (4) baking the coating film and the conductive paste.

In this type of laminated electronic device, the patterning of holes used as via holes is generally performed by screen printing of an insulating paste. Accordingly, blurring and faintness are likely to occur on the coating film after screen printing caused by inappropriate viscosity of the paste, course screen mesh, and the like, and holes approximately of 100 µm or less in diameter used as via holes are difficult to form.

For example, a method is disclosed in Japanese Unexamined Patent Application Publication No. 6-283846 in which the desired via holes are formed by a step of preparing a photosensitive insulating paste by adding a photosensitive organic component, such as a photopolymerizable monomer and a photopolymerization initiator, to an insulating paste primarily composed of glass, mixing the paste thus prepared, coating the insulating paste thus formed on a substrate, and forming the desired via holes by exposing and developing. Since a photolithographic method using a photosensitive insulating paste is a patterning method using exposing and developing, fine via holes can be formed with a high degree of accuracy.

Recently, it is desired in a photolithographic method using a photosensitive insulating paste or a photosensitive conductive paste that development be performed using water or an aqueous alkaline solution in consideration of environmental conservation. In response to this desire, an organic binder having acidic functional groups, such as carboxyl groups, is used in a photosensitive organic component.

However, when glass such as $SiO_2$—$Bi_2O_3$—$B_2O_3$ glass is used as an insulating component in a photosensitive insulating paste, multivalent metal ions of the multivalent metal oxide in the glass may dissolve in the solute of the paste in some cases. In such cases, the multivalent metal ions react with acidic functional groups (anions of the organic binder) so as to form a three-dimensional network in the paste by ionic cross-linking, and as a result, the paste itself is gelled. When the photosensitive insulating paste is gelled, the coating step is difficult to perform, and even if the coating can be performed, reliable development thereof is difficult to achieve.

In electronic devices primarily for use in various electronic apparatuses, such as mobile information terminals and computers, concomitant with greater information processing, higher signal processing speed (in particular, higher frequency) are required. In response to this requirement, the conductive pattern for transmitting signals is required to have a finer design (i.e., less width) yet a thicker film.

In general, a conductive pattern is formed by a method in which a powdered conductive metal, such as silver or copper, is added to and mixed with an organic vehicle so as to prepare a conductive paste, the desired conductive pattern is formed by the conductive paste on a non-baked or a baked insulating substrate, and after drying, the conductive pattern on the substrate is then baked. The formation of conductive patterns on insulating substrates is generally performed by a screen printing method using a screening mesh, and in such a method, blurring and faintness of the pattern which are caused by inappropriate viscosity of the paste, coarse mesh size, and the like, are difficult to avoid. Hence, a pattern having wire widths and wire spaces of approximately 50 µm, respectively, is the limit of the screen printing method.

The formation of a fine and thick film wiring by a photolithographic method using a photosensitive conductive paste is disclosed in Japanese Unexamined Patent Applications Publication Nos. 5-287221 and 8-227153. In this method, a photosensitive conductive paste which is composed of a powdered conductive metal, a photosensitive organic component formed of an acrylic copolymer, a photoreactive compound and a photopolymerization initiator, is coated on the entire surface of an insulating substrate, and after drying, the desired conductive pattern is then formed by a photolithographic method.

When a conductive pattern is formed on a ceramic substrate using a photosensitive conductive paste, an inorganic additive component, such as $PbO$—$B_2O_3$—$SiO_2$ glass or $SiO_2$—$Bi_2O_3$—$B_2O_3$ glass, may be added to and mixed with the photosensitive conductive paste in order to improve the adhesive strength between the conductive pattern and the ceramic substrate (refer to Japanese Unexamined Patent Applications Publication Nos. 6-224538, 8-335757). In consideration of environmental conservation, the development of the photosensitive conductive paste is desired to be performed using water or an aqueous alkaline solution. As is the case with the photosensitive insulating paste, an organic binder having an acidic functional group, such as a carboxyl group, is used in the photosensitive organic component.

However, as is also the case with the photosensitive insulating paste, multivalent metal ions of the inorganic additive component (such as powdered glass) contained in a photosensitive conductive paste dissolve in the solution for the photosensitive conductive paste and react with the acidic functional groups of the organic binder, forming a three-dimensional network in the paste by ionic cross-linking, and as a result, the paste itself is gelled.

Thus, in a photosensitive conductive paste composed of an inorganic additive component having multivalent metal ions capable of being dissolved and a photosensitive organic component containing an organic binder having an acidic functional group, the formation of a three-dimensional network by ionic cross-linking is likely to occur. As a result, the photosensitive conductive paste is easily gelled, and when the gelation progresses, coating is difficult to perform, or even if the coating can be performed, reliable development of the pattern is difficult to perform.

As methods for preventing gelation of photosensitive pastes, such as photosensitive insulating pastes and photosensitive conductive pastes, for example, a method is disclosed in Japanese Unexamined Patent Application Publication No. 9-218509 in which a compound containing a phosphorous compound, such as phosphoric acid, is present, a method is disclosed in Japanese Unexamined Patent Application Publication No. 9-218508 in which a compound having an azole structure, such as benzotriazole, is disclosed, and a method is disclosed in Japanese Unexamined Patent Application Publication No. 9-222723 in which an organic compound having a carboxyl group, such as acetic acid, is present. However, the methods mentioned above only prolong the time for gelation of the photosensitive paste to some extent.

In Japanese Unexamined Patent Application Publication No. 10-171107, a method is disclosed in which 3-methyl-3-methoxybutanol is present in a photosensitive paste. In this method, however, even though the gelation of the paste itself can be prevented, a phenomenon similar to gelation is observed in the coating film after drying, that is, a three-dimensional network by ionic cross-linking is found, and as a result, the molecular weight of the film is substantially increased. Accordingly, non-exposed areas of the film are difficult to dissolve in the developing solution during development.

SUMMARY OF THE INVENTION

In consideration of the problems described above, it is an object of the present invention to provide a photosensitive thick film composition formed by mixing a photosensitive organic component containing an organic binder having an acidic functional group and an inorganic component containing a polyvalent metal compound in which the gelation is suppressed, and various fine patterns can be formed with a high degree of accuracy, and to provide an electronic device using the photosensitive thick film composition.

Through intensive research by the inventors of the present invention in order to solve the problems described above, it was discovered that when a polyhydroxy alcohol (polyol), i.e., an alcohol which had a plurality of hydroxyl groups, was present in a photosensitive thick film composition (photosensitive thick film paste) comprising a photosensitive organic component containing an organic binder having an acidic functional group and an inorganic component containing a polyvalent metal compound, the gelation of the photosensitive thick film composition could be satisfactory suppressed.

That is, the photosensitive thick film composition according to the present invention comprises a photosensitive organic component containing an organic binder having an acidic functional group, an inorganic component containing a polyvalent metal compound, and an alcohol having a plurality of hydroxyl groups.

According to the photosensitive thick film composition of the present invention, since the alcohol having a plurality of hydroxyl groups is present, gelation can be satisfactory suppressed both when the composition is a paste before coating and is a film after coating and drying, and hence, various patterns, such as via holes and conductive patterns, can be finely formed with a high degree of accuracy.

The reason for this is that since the hydroxyl groups (—OH) of the polyhydroxy alcohol have a significantly strong bonding force with the polyvalent metal ions compared to that of the acidic functional group (such as carboxyl group) of the organic binder, the polyvalent metal ions dissolved in the solution for the photosensitive insulating paste react with the polyhydroxy alcohol before the metal ions react with anions of the organic binder, and hence, ionic cross-linking formed by the anions of the organic binder and the metal ions of the polyvalent metals can be prevented. That is, the formation of a three-dimensional network formed by the cross-linking can be prevented.

The photosensitive thick film composition according to the present invention may be a photosensitive insulating paste containing an insulating inorganic component, a photosensitive dielectric paste containing a dielectric inorganic component or a photosensitive magnetic paste containing a magnetic inorganic component. In addition, the photosensitive thick film composition may be a photosensitive conductive paste containing a conductive metal component.

Since using the photosensitive thick film of the present invention, gelation can be suppressed and various patterns, such as via holes and conductive patterns, can be finely formed with a high degree of accuracy, miniaturization and improvement in reliability of electronic devices, which have functioning layers provided with via holes therein or have conductive patterns formed on substrates compose of a ceramic or the like, can be achieved.

DESCRIPTION OF THE PREFERRED EMBODIMENTS

Figure 1:
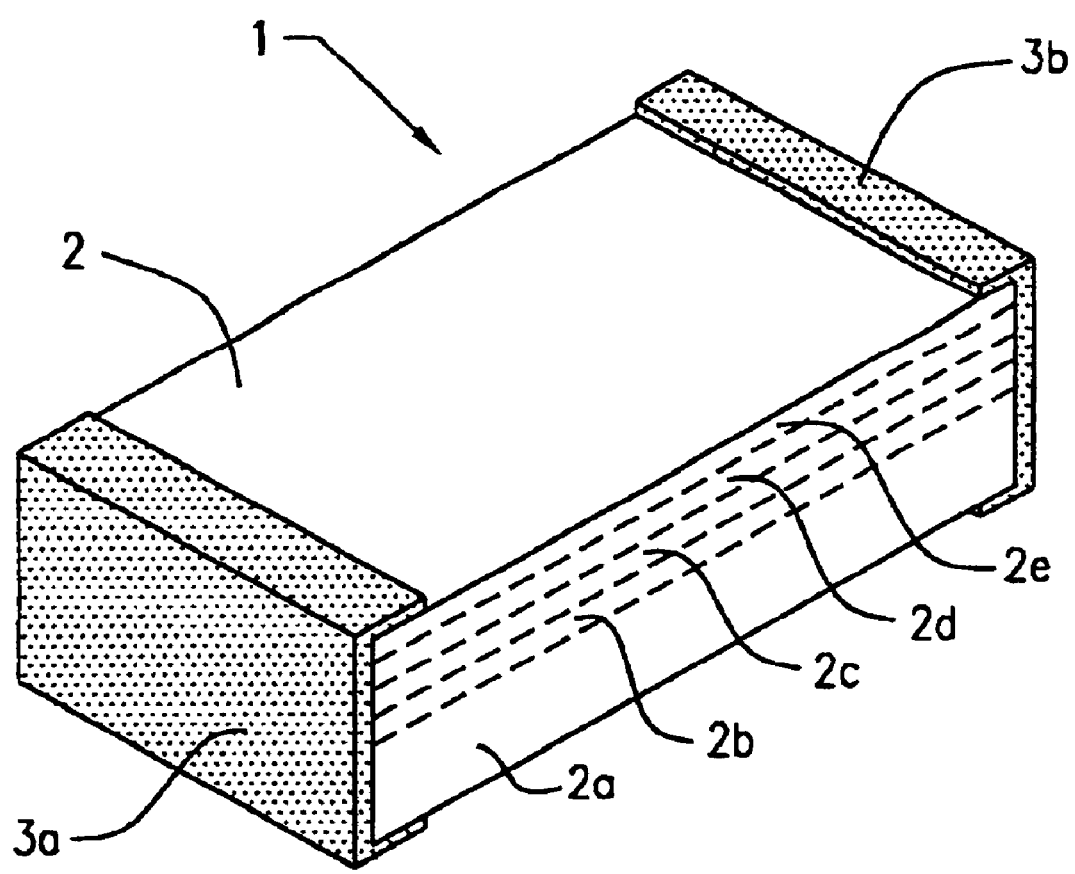
FIG. 1 is a schematic perspective view of a chip inductor according to an embodiment of the present invention.

Hereinafter, a photosensitive thick film composition according to the present invention will be described in detail.

In the photosensitive thick film composition of the present invention, an alcohol having a plurality of hydroxyl groups acts as an anti-gelling agent. As a polyhydroxy alcohol, there may be mentioned, for example, an aliphatic polyhydroxy alcohol, such as methylene glycol, ethylene glycol, propylene glycol, butylene glycol, pentamethylene glycol, hexamethylene glycol, heptanediol, octanediol, nonanediol, decanediol, diethylene glycol, dipropylene glycol, glycerin, butanetriol, pentanetriol, hexanetriol, heptanetriol, butanetetrol and glycitol; a polyhydroxy alcohol having a carboxyl group such as gluconic acid; an aromatic polyhydroxy alcohol such as guaiacol; and a polymeric polyhydroxy alcohol such as a low molecular weight polyvinyl alcohol.

As the polyhydroxy alcohol, an alcohol having two to about six hydroxyl groups is preferable. For example, there may be mentioned ethylene glycol, propylene glycol, trimethylene glycol, butylene glycol, tetramethylene glycol, pentamethylene glycol, butenediol, hexamethylene glycol, heptanediol, octanediol, nonanediol, decanediol, diethylene glycol, dipropylene glycol, triethylene glycol, tripropylene glycol, glycerin, hexanetriol, heptanetriol, and the like, as a trivalent alcohol; threitol, erythritol, arabitol, xylitol, ribitol, adonitol, glucitol, mannitol, iditol, talitol, galactitol, malitol, and the like. In addition, a heptahydroxy alcohol such as perseitol, volemitol, and the like, may also be used.

In particular, glucitol, a hexahydroxy alcohol, is a preferable material since it easily forms a complex with the polyvalent metal ions of the polyvalent metal compound contained in the inorganic component and effectively prevents the formation of bonds between the acidic functional groups in the organic binder and the polyvalent metal ions.

When the polyhydroxy alcohol in the photosensitive thick film composition is totally consumed before exposing and developing, the anti-gelling effect for the coating film after drying is decreased, and hence, the development of the film is less reliably performed. Accordingly, in order to allow the polyhydroxy alcohol to remain, even in a small amount, in the coating film after drying so as to more reliably perform reliable developing, the boiling point of the polyhydroxy alcohol is preferably about 178° C. or more.

When the polyhydroxy alcohol is liquid at room temperature, the alcohol is preferably present in a ratio of from about 0.1 to 5 parts by weight per part of the inorganic component. When the ratio is less than about 0.1, it is difficult to sufficiently prevent gelation, and on the other hand, when the ratio is more than about 5, the viscosity of the photosensitive thick film composition is decreased, and hence, the coating properties thereof are degraded.

When the polyhydroxy alcohol is solid at room temperature, the alcohol preferably occupies about 0.01 to 20 percent by weight of the total of the polyhydroxy alcohol and the inorganic component. When the content thereof is less than about 0.01 percent by weight, it is difficult to sufficiently prevent gelation, and on the other hand, when the content is more than about 20 percent by weight, the viscosity of the photosensitive thick film composition is increased, and hence, the preparation thereof and the film formation become difficult.

When an insulating inorganic component, such as glass, is used as the inorganic component in the photosensitive thick film composition of the present invention, a photosensitive insulating paste is obtained. When a dielectric inorganic component, such as a barium titanate ceramic, is used, a photosensitive dielectric paste is obtained, and when a magnetic inorganic component, such as ferrite, is used, a photosensitive magnetic paste is obtained.

The inorganic component mentioned above preferably occupies a volume fraction of about 30 to 90% in the photosensitive thick film composition (photosensitive insulating paste or the like). When the volume fraction is less than about 30%, the volume shrinkage during baking easily tends to increase. In contrast, when the volume fraction is more than about 90%, the strength of the coating film may be degraded in some cases. In the present invention, the volume fraction is the ratio of the volume of the inorganic component in the photosensitive thick film composition to the volume of the solid component in the photosensitive thick film composition. The solid component is the component which is not lost in drying before exposing and developing, and in addition to the inorganic component, the organic binder is also included in the solid component. Furthermore, when a polyhydroxy alcohol which is solid at room temperature is selected, the alcohol is also included in the solid component since it is not lost by general drying.

The inorganic component described above may be an inorganic component in a powder form (i.e., inorganic powder), and more particularly, is preferably powdered glass or a powdered ceramic. In addition, the average particle diameter (D50) of the powdered inorganic component is preferably about 0.1 to 10 μm since the amount of light required during exposure can be controlled to be as small as possible, and developing can be reliably performed. When the average diameter of the powdered inorganic component is less than about 0.1 μm, the exposure sensitivity is degraded, and hence, the amount of light required for exposing tends to increase. On the other hand, when the average diameter exceeds about 10 μm, the resolution may be degraded in developing due to particles having larger diameters.

As the powdered glass, any known powdered glass such as powdered borosilicate glass may be used, and as the powered ceramic, various powdered ceramics, such as a powdered insulating ceramic, a powdered dielectric ceramic and a powdered magnetic ceramic, may be used. In particular, since an electronic device having superior high frequency characteristics can be formed, a low temperature sinterable powdered ceramic, such as a powdered crystallized glass-based ceramic, a powdered glass composite ceramic or a powdered non-glass ceramic, which can be sintered together with a metal having a low melting point, such as Ag or Cu is preferable.

In the photosensitive thick film composition of the present invention, the inorganic component described above is an accessory component; however, when a powdered conductive metal is contained therein, a photosensitive conductive paste can be prepared.

In the case described above, at least one powdered conductive metal selected from the group consisting of gold, silver, copper, platinum, aluminum, palladium, nickel, molybdenum and tungsten may be used as the conductive metal component. When a polyvalent metal, such as copper, aluminum, palladium, nickel, molybdenum or tungsten, is used as the conductive metal component, the polyvalent metal ions of the polyvalent conductive metal may form ionic cross-linking with the anions in the organic binder, and as a result, the gelation may occur in some cases. However, when a predetermined amount of the polyhydroxy alcohol is present according to the present invention, the gelation caused by the ionic cross-linking and the formation of the three-dimensional network can be suppressed.

In order to improve the sintering characteristics of the conductive metal component, the total of the conductive metal component and the inorganic component preferably occupies a volume fraction of about 30 to 89% in the photosensitive thick film composition (photosensitive conductive paste). When the volume fraction is less than about 30%, volume shrinkage in baking is increased, and for example, the wire (i.e., the conductive line) may break in some cases when a conductive pattern is formed. On the other hand, when the volume fraction exceeds about 89%, the strength of the coating film may be decreased in some cases. In the present invention, the volume fraction is the ratio of the total volume of the conductive metal component and the inorganic component in the photosensitive thick film composition to the volume of the solid component in the photosensitive thick film composition. The solid component is the component which is not lost in drying before exposing and developing, and in addition to the conductive metal component and the inorganic component, the organic binder is also included in the solid component. Furthermore, when a polyhydroxy alcohol which is solid at room temperature is selected, the alcohol is also included in the solid component since it is not lost by general drying. In the case described above, the conductive metal component preferably occupies about 30 to 95 percent by weight in the total of the conductive metal component and the inorganic component.

Both when the photosensitive thick film composition is a photosensitive insulating paste and is a photosensitive conductive paste, the inorganic component, such as powdered glass or a powdered ceramic, may be a polyvalent metal compound containing ions of at least one polyvalent metal selected from the group consisting of boron, lead, zinc, bismuth, aluminum, magnesium, calcium, barium, titanium, strontium, zirconium, manganese, cobalt, nickel, iron, yttrium, niobium, lanthanum and ruthenium. When the inorganic component contained in the photosensitive thick film composition is a polyvalent metal compound, the polyvalent metal ions dissolve into the solute of the composition and can react with the acidic functional groups (in particular, carboxyl groups) of the organic binder, whereby the gelation occurs. However, when the polyhydroxy alcohol is contained in the photosensitive thick film composition according to the present invention, the alcohol prevents the reaction between the polyvalent metal ions and the anions of the organic binder, and hence, the gelation can be suppressed.

In particular, as a powdered glass which may be used, there may be mentioned, for example, $SiO_2$—PbO-based, $SiO_2$—ZnO-based, $SiO_2$—$Bi_2O_3$-based, $SiO_2$—$K_2O$-based, $SiO_2$—$Na_2O$-based, $SiO_2$—PbO—$B_2O_3$-based, $SiO_2$—ZnO—$B_2O_3$-based, $SiO_2$—$Bi_2O_3$—$B_2O_3$-based, $SiO_2$—$K_2O$—$B_2O_3$-based or $SiO_2$—$Na_2O$—$B_2O_3$-based amorphous glass. As a powdered ceramic which may be used, there may be mentioned an oxide, a boride, a nitride, a silicon compound or the like, of at least one polyvalent metal selected from the group consisting of Al, Ba, Ti, Sr, Pb, Zr, Mn, Co, Ni, Fe, Y, Nb, La and Ru. As a usable powdered ceramic, more particularly, there may be mentioned, for example, a powdered insulating ceramic, such as $Al_2O_3$, or $ZrO_2$, a powdered dielectric ceramic, such as $BaTiO_3$, a powdered ferrite, such as nickel-zinc-ferrite, or nickel-zinc-copper-ferrite, a powdered high resistance ceramic composed of a composite oxide of, for example, $RuO_2$, $Pb_2Ru_2O_7$, $Bi_2Ru_2O_7$ or Mn—Co—Ni, and a powdered piezoelectric ceramic such as PZT.

In the photosensitive thick film composition of the present invention, the organic binder is preferably an acrylic copolymer having carboxyl groups in the side chains. The organic binder described above is a material which is effective as a photosensitive organic binder, and development can be performed by using an alkaline-based or a water-based developing solution. In the case in which the organic binder is an acrylic copolymer having carboxyl groups as side chains, and the inorganic component contains the powdered glass or the powdered ceramic described above, a three-dimensional network is easily formed by ionic cross-linking. However, when the polyhydroxy alcohol described above is contained in the composition, the three-dimensional network (i.e., the gelation) formed by ionic cross-linking can be effectively suppressed.

The acrylic copolymer having carboxyl groups as side chains can be formed by, for example, copolymerizing an unsaturated carboxylic acid and an ethylenic unsaturated compound. As an unsaturated carboxylic acid, there may be mentioned acrylic acid, methacrylic acid, maleic acid, fumaric acid, vinyl acetic acid, the anhydrides thereof, and the like. As an ethylenic unsaturated compound, there may be mentioned, for example, an acrylic ester such as methyl acrylate or ethyl acrylate; a methacrylic ester such as methyl methacrylate or ethyl acrylate; or a fumaric ester such as monoethyl fumarate. In addition, an acrylic copolymer having an unsaturated bond in the structure may also be used. This includes:

(1) An acrylic copolymer having carboxyl groups as side chains, which is bonded by addition with an acrylic monomer having a functional group, such as an epoxy group, which is reactive with the carboxyl groups mentioned above.

(2) An acrylic copolymer which is obtained by a step of performing a reaction between an acrylic copolymer having epoxy groups instead of carboxyl groups as side chains and an unsaturated monocarboxylic acid, and a subsequent step of bonding a saturated or an unsaturated polyvalent carboxylic anhydride to the acrylic copolymer.

In addition to the organic binder having an acidic functional group, the photosensitive organic component of the present invention contains a photopolymerizable monomer (monomer having a reactive functional group), a photopolymerization initiator, an organic solvent, and the like. In particular, the materials described below are preferably present:

(1) A mixture of a monomer or an oligomer having a reactive functional group such as an unsaturated group and a photoradical generator such as an aromatic carbonyl compound, (2) A so-called diazo resin such as a condensation product of an aromatic diazonium compound and formaldehyde, (3) A mixture of an addition polymerizable compound such as an epoxy compound and a photoacid generator such as a diallyl iodinium salt, and (4) A naphthoquinonediazido compound.

Among those mentioned above, in particular, a mixture is preferable which is composed of a monomer or an oligomer having a reactive functional group, such as an unsaturated group, and a photoradical generator, such as an aromatic carbonyl compound.

As a monomer or an oligomer having a reactive functional group, there may be mentioned, for example, hexanediol triacrylate, tripropylene glycol triacrylate, trimethylolpropane triacrylate, stearic acrylate, tetrahydrofurfuryl acrylate, lauryl acrylate, 2-phenoxyethyl acrylate, isodecyl acrylate, isooctyl acrylate, tridecyl acrylate, caprolactone acrylate, ethoxylated nonyl phenol acrylate, 1,3-butanediol diacrylate, 1,4-butanediol diacrylate, diethylene glycol diacrylate, tetraethylene glycol diacrylate, triethylene glycol diacrylate, ethoxylated bisphenol A diacrylate, propoxylated neopentyl glycol diacrylate, tris(2-hydroxyethyl) isocyanurate triacrylate, ethoxylated trimethylolpropane triacrylate, pentaerythritol triacrylate, propoxylated trimethylolpropane triacrylate, propoxylated glyceryl triacrylate, pentaerythritol tetraacrylate, ditrimethylolpropane tetraacrylate, dipentaerythritolhydroxy pentaacrylate, ethoxylated pentaerythritol tetraacrylate, tetrahydrofurfuryl methacrylate, cyclohexyl methacrylate, isodecyl methacrylate, lauryl methacrylate, triethylene glycol dimethacrylate, ethylene glycol dimethacrylate, tetraethylene glycol dimethacrylate, 1,4-butanediol dimethacrylate, diethylene glycol dimethacrylate, 1,6-hexanediol dimethacrylate, neopentyl glycol dimethacrylate, 1,3-butylene glycol dimethacrylate, ethoxylated bisphenol A dimethacrylate, trimethylolpropane triacrylate or the like.

As a photoradical generator, there may be mentioned benzil, benzoin ethyl ether, benzoin isobutyl ether, benzoin isopropyl ether, benzophenone, benzoyl benzoate, methyl benzoyl benzoate, 4-benzoyl-4'-methyl diphenyl sulfide, benzyl dimethyl ketal, 2-n-butoxy-4-dimethyl aminobenzoate, 2-chlorothioxanthone, 2,4-diethyl thioxanthone, 2,4-diisopropyl thioxanthone, isopropyl thioxanthone, 2-dimethyl aminoethyl benzoate, p-dimethyl ethyl aminobenzoate, p-dimethyl isoamyl aminobenzoate, 3,3'-dimethyl-4-methoxy benzophenone, 2,4-dimethyl thioxanthone, 1-(4-dodecylphenyl)-2-hydroxy-2-methyl propane-1-one, 2,2-dimethoxy-1,2-diphenylmethane-1-one, hydroxycyclohexyl phenyl ketone, 2-hydroxy-2-methyl-1-phenylpropane-1-one, 1-[4-(2-hydroxyethoxy)-phenyl]-2-hydroxy-2-methyl-1-propane-1-one, 2-methyl-1-[4-(methylthio)phenyl]-2-morpholinopropane-1-one, methyl benzoyl formate, 1-phenyl-1,2-propanedione-2-(o-ethoxycarbonyl)oxime, 2-benzyl-2-dimethylamino-1-(4-morpholinophenyl)-1-butanone, bis(2,6-dimethoxybenzoyl)-2,4,4-trimethylpentylphosphine oxide and bis(2,4,6-trimethyl benzoyl)-phenylphosphine oxide.

In the photosensitive organic component, an ultraviolet absorber is preferably present. By containing an ultraviolet absorber, the characteristic of absorbing ultraviolet light is improved, and exposure defects caused by light scattering can be simultaneously suppressed. As an ultraviolet absorber, an azo-based red pigment, an amine-based red dye and the like, may be mentioned.

In addition, in the photosensitive thick film composition, a storage stabilizer such as a polymerization inhibitor, an oxidation inhibitor, a dye, a pigment, an anti-foaming agent, a surfactant, and the like, may be optionally contained when necessary. The photosensitive thick film composition of the present invention may be a composition in the form of a slurry in addition to a composition in the form of a paste.

Next, an electronic device using the photosensitive insulating paste and the photosensitive conductive paste according to the photosensitive thick film composition of the present invention will be described.

Figure 2:
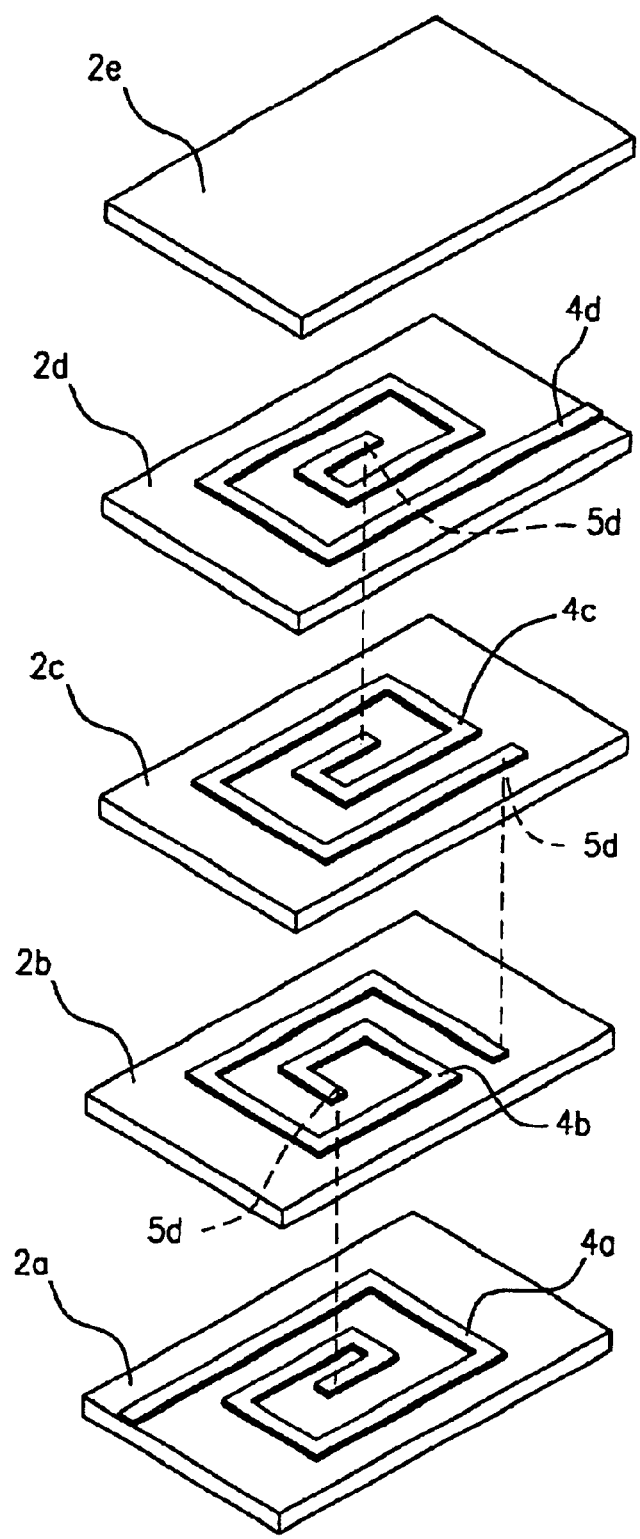
FIG. 2 is a schematic exploded perspective view of the chip inductor.

As shown in FIGS. 1 and 2, a chip inductor 1 as an electronic device has a laminated structure in which, on an insulating substrate 2a composed of alumina or the like, insulating layers 2b, 2c, 2d and 2e, which are formed of the photosensitive thick film composition (in this case, the photosensitive insulating paste) of the present invention, are sequentially formed. In the chip inductor 1, on both sides of a base body 2 composed of the insulating substrate 2a and the insulating layers 2b to 2e, external electrodes 3a and 3b are formed, and inside the base body 2, internal electrodes 4a, 4b, 4c and 4d in spiral form composed of the photosensitive thick film composition (in this case, the photosensitive conductive composition) of the present invention are provided.

That is, inside the base body 2, the internal electrodes 4a, 4b, 4c and 4d in spiral form are provided between the insulating layers 2a and 2b, between the insulating layers 2b and 2c, between the insulating layers 2c and 2d, and between the insulating layers 2d and 2e, respectively. In addition, the internal electrode 4a provided between the insulating layers 2a and 2b and the internal electrode 4d provided between the insulating layers 2d and 2e are connected to the external electrodes 3a and 3b, respectively.

In addition, the internal electrode 4a provided between the insulating layers 2a and 2b is electrically connected to the internal electrode 4b provided between the insulating layers 2b and 2c via a via hole 5b formed in the insulating layer 2b. In a manner equivalent to the above, the internal electrodes 4b and 4c are electrically connected to each other via a via hole 5c formed in the insulating layer 2c, and the internal electrodes 4c and 4d are electrically connected to each other via a via hole 5d formed in the insulating layer 2d.

The insulating layers 2b to 2d are formed by steps of coating of the photosensitive insulating paste of the present invention, film formation, drying, exposing, developing and baking, and the via holes 5b, 5c and 5d having fine and superior finished shapes are provided therein, respectively. The internal electrodes 4a to 4d are formed by steps of coating of the photosensitive conductive paste of the present invention, film formation, drying, exposing, developing and baking, and hence, the fine electrode patterns are formed with a high degree of accuracy. Accordingly, the chip inductor 1 is a highly reliable chip inductor 1 in which miniaturization and higher density can be achieved.

Next, a method for manufacturing the chip inductor 1 will be described.

The photosensitive conductive paste of the present invention is first coated on the entire surface of the insulating layer 2a composed of alumina or the like, and the coating is then dried under predetermined conditions. In a manner equivalent to a general method, for example, the drying of the coating is performed at 40 to 100° C. for 10 minutes to 2 hours. Subsequently, a coil pattern in a spiral form having a line width of, for example, 50 μm is exposed on the dried coating film via a predetermined photomask. Unnecessary parts of the coating film are removed by using a water-based or an alkaline-based developing solution, and baking is then performed at, for example, 850° C. for approximately 1 hour in the air, thereby forming the internal electrode 4a. The coating of the photosensitive conductive paste may be performed by a screen printing method, a spin coating method, a doctor blade method, or the like.

Next, the photosensitive insulating paste of the present invention is coated on the insulating substrate 2a so as to cover the internal electrode 4a, thereby forming an insulating coating film. After the coating film is dried, a pattern for forming a via hole having a diameter of, for example, 50 μm is then exposed on a predetermined area of the insulating film via a photomask. Subsequently, unnecessary parts of the film are removed by developing, and baking is then performed at, for example, a predetermined temperature for a predetermined time in the air, thereby forming the insulating layer 2b provided with a hole used as a via hole. In this step, the coating of the photosensitive insulating paste may be performed by a screen printing method, a spin coating method, a doctor blade method, or the like. The coating film is dried at, for example, 40 to 100° C. for 10 minutes to 2 hours. After a conductive material is filled in the hole used as a via hole formed in the insulating layer 2b and is then dried, the via hole 5b is formed which connects one edge of the internal electrode 4a with one edge of the internal electrode 4b.

In addition, in a manner equivalent to the steps described above, the internal electrode 4b in the spiral form is formed on the insulating layer 2b. After the insulating layer 2c having the via hole 5c therein, the internal electrode 4c, the insulating layer 2d having the via hole 5d therein, and the internal electrode 4d are sequentially formed in a manner equivalent to the above, a typical insulating paste or the photosensitive insulating paste of the present invention is coated on the insulating layer 2d so as to cover the internal electrode 4d, and after drying, the coating film thus formed is then baked at, for example, a predetermined temperature for a predetermined time in the air, thereby forming the insulating layer 2e for protection.

Subsequently, the base body 2 composed of the insulating substrate 2a, the insulating layers 2b, 2c, 2d and 2e is provided with the external electrodes 3a and 3b, whereby the chip inductor 1 is complete having a laminated structure provided with the coil pattern formed by the internal electrodes in the spiral forms.

According to the manufacturing method described above, the photosensitive insulating paste of the present invention is used so as to form the insulating layers 2b, 2c and 2d, whereby the via holes 5b, 5c and 5d having fine and superior finished shapes can be formed with a high degree of accuracy. That is, since the photosensitive insulating paste of the present invention has a small change in viscosity over time and superior storage characteristics, blurring or the like caused by the change in viscosity can be suppressed, and a significantly fine via hole about 150 μm or less in diameter, and in particular, about 50 μm or less in diameter, can be formed with a high degree of accuracy. In addition, since developing can be reliably performed by a photolithographic method, the via hole can be formed finely and accurately, and hence, a compact chip inductor 1 can be manufactured which has higher reliability, superior high frequency characteristics, and the like.

Since the photosensitive conductive paste of the present invention is used for forming the internal electrodes 4a, 4b, 4c and 4d by using a photolithographic method, these internal electrodes have a superior adhesive strength to the insulating substrate 2a and to the insulating layers 2b to 2d and are fine and thick films with a high degree of accuracy, whereby a compact and highly reliable chip inductor 1 having superior high frequency characteristics can be obtained.

Furthermore, since the chip inductor 1 thus formed is compact, highly efficient and highly reliable, when the chip inductor 1 is used for the purpose of removing noise in, for example, mobile communication terminals and computers, the advantages thereof are fully exploited, and simultaneously, a compact and light-weight electronic apparatus having high reliability can be realized.

Heretofore, the chip inductor is described as an electronic device according to the present invention; however, the present invention is not limited thereto. For example, the electronic device according to the present invention may be a surface mounting chip electronic device, such as a multilayer ceramic capacitor or a multilayer LC filer; a functional module, such as a voltage controlled oscillator (VCO) or a phase locked loop (PLL); a multilayer ceramic substrate on which semiconductor devices are mounted; and a ceramic package.

In addition, the photosensitive thick film composition of the present invention is not only used for the photosensitive insulating paste described above, but is also used for forming ceramic green sheets having photosensitivity when the composition is prepared so as to be in the form of a slurry. Furthermore, in addition to the formation of via holes, the photosensitive thick film composition of the present invention can be used for the formation of optional insulating patterns, dielectric patterns, resistance patterns and magnetic patterns. That is, when the inorganic component in the photosensitive thick film composition is an insulating inorganic component, the baked film thereof can be formed into an insulating pattern; when the inorganic component is a dielectric inorganic component, the baked film thereof can be formed into a dielectric pattern; when the inorganic component is a high resistance inorganic component, the baked film thereof can be formed into a resistance pattern; and when the inorganic component is a magnetic inorganic component, the baked film thereof can be formed into a magnetic pattern. These patterns can be formed to be fine and highly accurate.

In the embodiment described above, the formation of the conductive pattern on the sintered insulating layer is described. However, an electronic device, such as a multilayer ceramic substrate, may be manufactured by steps of coating the photosensitive conductive paste of the present invention on ceramic green sheets, patterning the coated paste by a photolithographic method, laminating and compressing a predetermined number of the ceramic green sheets, and baking the compressed laminate thus formed. In addition, the formation of the conductive pattern on the ceramic green sheet may be performed directly thereon; however, a method may be used in which a conductive pattern is formed on a supporting body in the form of film, such as a polyethylene terephthalate (PET) film, and the pattern formed on the PET film is then transferred on the ceramic green sheet.

As the ceramic green sheet described above, a material may be used which is formed into sheets from a slurry obtained by mixing a powdered ceramic and an organic vehicle. In addition, powdered glass may be mixed in the slurry described above. In particular, the ceramic green sheet may be a green sheet composed of $Al_2O_3$ or the like and may also be composed of, for example, a powdered insulating ceramic, such as a crystallized glass-based ceramic, a glass composite ceramic and a non-glass ceramic; a powdered dielectric ceramic, such as $BaTiO_3$; powdered ferrite, such as nickel-zinc ferrite and nickel-zinc-copper ferrite; a powdered high resistance ceramic composed of a composite oxide of, for example, $RuO_2$, $Pb_2Ru_2O_7$, $Bi_2Ru_2O_7$ and Mn—Co—Ni; and a powdered piezoelectric ceramic such as PZT. Furthermore, a photosensitive green sheet may be used which has a structure provided with a fine via hole formed by a photolithographic method using a photosensitive green sheet containing a photosensitive organic component in an organic vehicle.

EXAMPLES

Hereinafter, photosensitive thick film compositions according to the present invention will be described with reference to the examples.

Photosensitive Insulating Paste

Example 1

After mixing the following components in the amounts set forth below, the mixture was kneaded by a three-roll mill, thereby yielding the photosensitive insulating paste shown in Table 1.

Glass powder: $SiO_2$—$K_2O$—$B_2O_3$-based powdered glass (the content of boric acid was 17%), 5.0 g Organic binder: a copolymer of methacrylic acid and methyl methacrylate in a ratio by weight of 25 to 75 (the mean weight average molecular weight was 50,000), 2.0 g Monomer having a reactive functional group: trimethylolpropane triacrylate, 1.0 g Photopolymerization initiator: 2-methyl-1-[4-(methylthio)phenyl]-2-morpholinopropane-1-one (photopolymerization initiator A), 0.4 g Photopolymerization initiator: 2,4-diethyl thioxanthone (photopolymerization initiator B), 0.1 g Organic solvent: ethyl carbitol acetate, 4.0 g Polyhydroxy alcohol: glucitol (a hexahydroxy alcohol), 0.1 g Next, the photosensitive insulating paste of this example was coated on an insulating substrate composed of alumina by spin coating and was then dried at 100° C. for 1 hour, thereby forming a coating film 30 μm thick. Subsequently, after the coating film thus formed was held for a predetermined time, an exposing process was preformed. The exposing process was performed by irradiating light of a high pressure mercury lamp (the amount of exposure: 250 mj/cm$^2$) via a mask having a pattern for a via hole 50 μm in diameter.

In addition, development was performed by using an aqueous solution of sodium carbonate, thereby forming a non-baked insulating layer having a hole used as a via hole 50 μm in diameter therein on the insulating substrate composed of alumina. The insulating layer was then baked at 850° C. in the air, thereby forming an insulating layer having a hole used as a via hole 80 μm in diameter.

Examples 2 to 10

In a manner equivalent to that described in the example 1, photosensitive insulating pastes having compositions shown in Table 1 below were prepared. In these examples, pentamethylene glycol of example 2 is a dihydroxy alcohol, glycerin of example 3 was a trivalent alcohol, erythritol of example 4 is a tetrahydroxy alcohol, xylitol of example 5 is a pentahydroxy alcohol, and mannitol of example 6 is a hexahydroxy alcohol. In addition, 3-methoxy-3-methyl butanol of example 7 is a monohydroxy alcohol.

The storage conditions (storage stabilities) of the photosensitive insulating pastes of the examples 1 to 10 were evaluated at 20° C. or less in the air immediately after the preparations thereof and were also evaluated after 1 day, 3 days, 1 week and 1 month. The results are shown in Table 2 below. In Table 2, "O" indicates that the photosensitive insulating paste was not gelled at the predetermined time for evaluation, and the coating formation and pattern formation thereof could be performed. In addition, "x" in the table indicates that the photosensitive insulating paste was gelled, and hence, the coating formation could not be performed, or the pattern formation could not be performed since the non-exposed areas did not the developing solution.

TABLE 2

| EXAMPLE | IMMEDIATELY AFTER PREPARATION | AFTER 1 DAY | AFTER 3 DAYS | AFTER 1 WEEK | AFTER 1 MONTH |
|---|---|---|---|---|---|
| 1 | O | O | O | O | O |
| 2 | O | O | O | O | O |
| 3 | O | O | O | O | O |
| 4 | O | O | O | O | O |
| 5 | O | O | O | O | O |
| 6 | O | O | O | O | O |
| 7 | O | O | O | O | O |
| 8 | O | x | x | x | x |
| 9 | O | x | x | x | x |
| 10 | O | x | x | x | x |

As can be seen from the results, the photosensitive insulating pastes containing dihydroxy to hexahydroxy alcohols of the examples 1 to 6 were not gelled at all predetermined times for evaluation. That is, immediately after the preparation of the pastes and after 1 day, 3 days, 1 week and 1 month, the coating could be performed on the insulating substrate composed of alumina by spin coating, and the patterning could also be performed by a photolithographic method.

TABLE 1

| EXAMPLE | INORGANIC COMPONENT | ORGANIC COMPONENT | | | | | | |
|---|---|---|---|---|---|---|---|---|
| | POWDERED GLASS | ORGANIC BINDER | MONO-eMER | POLYMERIZATION INITIATOR A | POLYMERIZATION INITIATOR B | ORGANIC SOLVENT | ADDITIVE AMOUNT | ADDITIVE TYPE |
| 1 | 5.0 g | 2.0 g | 1.0 g | 0.4 g | 0.1 g | 4.0 g | 0.1 g | GLUCITOL |
| 2 | 5.0 g | 2.0 g | 1.0 g | 0.4 g | 0.1 g | 4.0 g | 1.0 g | PENTAMETHYLENE GLYCOL |
| 3 | 5.0 g | 2.0 g | 1.0 g | 0.4 g | 0.1 g | 4.0 g | 1.0 g | GLYCERIN |
| 4 | 5.0 g | 2.0 g | 1.0 g | 0.4 g | 0.1 g | 4.0 g | 0.1 g | ERYTHRITOL |
| 5 | 5.0 g | 2.0 g | 1.0 g | 0.4 g | 0.1 g | 4.0 g | 0.1 g | XYLITOL |
| 6 | 5.0 g | 2.0 g | 1.0 g | 0.4 g | 0.1 g | 4.0 g | 0.1 g | MANNITOL |
| 7 | 5.0 g | 2.0 g | 1.0 g | 0.4 g | 0.1 g | 4.0 g | 0.1 g | 3-METHOXY-3-METHYL BUTANOL |
| 8 | 5.0 g | 2.0 g | 1.0 g | 0.4 g | 0.1 g | 4.0 g | 0.1 g | PHOSPHORIC ACID |
| 9 | 5.0 g | 2.0 g | 1.0 g | 0.4 g | 0.1 g | 4.0 g | 0.02 g | BENZOTRIAZOLE |
| 10 | 5.0 g | 2.0 g | 1.0 g | 0.4 g | 0.1 g | 4.0 g | 1.0 g | ACETIC ACID |

In contrast, when the compositions contain additives other than polyhydroxy alcohols, as were the cases with the examples 8 to 10, the pastes were gelled 1 day after the preparations thereof, so that the coating formation could not be performed, or the pattern formation could not be performed since the non-exposed areas did not dissolve in the developing solution. The composition containing 3-methoxy-3-methyl butanol, example 7, was not gelled immediately after the preparation thereof and after 1 day, 3 days, 1 week and 1 month, and the composition could be reliably coated on the insulating substrate by spin coating; however, after the coating film was dried, the non-exposed areas of the film did not dissolve in the developing solution in an exposing process, and hence, the pattern formation could not be performed.

Examples 11 to 16

As shown in Table 3 below, by changing the amount of glucitol added, photosensitive insulating compositions were prepared in a manner equivalent to that in the example 1. Glucitol is a solid hexahydroxy alcohol at room temperature (25° C.), and "ratio" in the column of the additive in Table 3 is a percent by weight of the glucitol of the total amount of the powdered glass and the glucitol.

TABLE 3

| EX-AMPLE | INORGANIC COMPONENT POWDERED GLASS | ORGANIC BINDER | MONOMER | POLYMERIZATION INITIATOR A | POLYMERIZATION INITIATOR B | ORGANIC SOLVENT | ADDITIVE (GLUCITOL) AMOUNT | RATIO |
|---|---|---|---|---|---|---|---|---|
| 11 | 50 g | 20 g | 10 g | 4 g | 1 g | 4 g | 1 mg | 0.002% |
| 12 | 50 g | 20 g | 10 g | 4 g | 1 g | 4 g | 4 mg | 0.008% |
| 13 | 50 g | 20 g | 10 g | 4 g | 1 g | 4 g | 6 mg | 0.012% |
| 14 | 50 g | 20 g | 10 g | 4 g | 1 g | 4 g | 3 g | 5.7% |
| 15 | 50 g | 20 g | 10 g | 4 g | 1 g | 4 g | 12.5 g | 20% |
| 16 | 50 g | 20 g | 10 g | 4 g | 1 g | 4 g | 13.3 g | 21% |

The formation of pattern having a via hole 50 μm in diameter was performed using the photosensitive insulating pastes of the examples 11 to 16 in a manner equivalent to that in the example 1. The storage stabilities of these compositions were also evaluated in a manner equivalent to that described above. In addition, coating properties of the pastes were also evaluated.

In Table 4, "O" in the column of the storage stabilities indicates that the photosensitive insulating paste was not gelled at the predetermined time for evaluation, and the coating formation and pattern formation thereof could be performed. In addition, "Δ" in the column of the storage stabilities indicates that after the coating formation was complete, the pattern formation was difficult to perform since the non-exposed areas did not easily dissolve in the developing solution. Furthermore, "O" in the column of the coating properties of the paste indicates that the difference between an intended thickness and an actual thickness was within ±0.5 μm, and "Δ" indicates that the difference between the intended thickness and the actual thickness exceeded ±0.5 μm.

TABLE 4

| | STORAGE STABILITIES | | | | | COATING |
|---|---|---|---|---|---|---|
| EX-AM-PLE | IMMEDIATELY PREPARATION | AFTER 1 DAY | AFTER 3 DAYS | AFTER 1 WEEK | AFTER 1 MONTH | PROPERTIES OF PASTE |
| 11 | O | O | O | Δ | Δ | O |
| 12 | O | O | O | O | Δ | O |
| 13 | O | O | O | O | O | O |
| 14 | O | O | O | O | O | O |
| 15 | O | O | O | O | O | O |
| 16 | O | O | O | O | O | Δ |

As can be seen from Table 4, the photosensitive insulating pastes of the examples 13 to 15 had superior storage stabilities over long periods of time, in which the polyhydroxy alcohols occupied about 0.01 to 20 percent by weight in the total of the glucitol and the powdered glass in the photosensitive insulating pastes. In addition, in the photosensitive insulating pastes described above, the non-exposed areas easily dissolved in the developing solution, and hence, via holes having superior shapes could be formed.

In contrast, when the amount of the glucitol added was small, as were the cases with the photosensitive insulating pastes of the examples 11 and 12, the formation of the coating film could be performed 1 week or 1 month after the preparation of the paste, but since the non-exposed areas thereof was difficult to dissolve in the developing solution, the pattern formation tended to be difficult. On the other hand, when the amount of the glucitol added was excessive, as was the case with the photosensitive insulating paste of the example 16, the storage stabilities thereof was superior; however, since the viscosity thereof was excessively increased, the coating properties tended to deteriorate to some extent.

Examples 17 to 22

As shown in Table 5 below, photosensitive insulating pastes were prepared by changing the amount of pentamethylene glycol added in a manner equivalent to that described in the example 1. Pentamethylene glycol is a liquid dihydroxy alcohol at room temperature (25° C.), and "ratio" in the column of the additive in Table 5 was a ratio by weight of the pentamethylene glycol to the powdered glass.

TABLE 5

| EX-AMPLE | INORGANIC COMPONENT POWDERED GLASS | ORGANIC BINDER | MONOMER | POLYMERIZATION INITIATOR A | POLYMERIZATION INITIATOR B | ORGANIC SOLVENT | ADDITIVE (PENTAMETHYLENE) GLYCOL AMOUNT | RATIO |
|---|---|---|---|---|---|---|---|---|
| 17 | 5.0 g | 2.0 g | 0.1 g | 0.4 g | 0.1 g | 4.0 g | 0.2 g | 0.04 |
| 18 | 5.0 g | 2.0 g | 0.1 g | 0.4 g | 0.1 g | 4.0 g | 0.4 g | 0.08 |
| 19 | 5.0 g | 2.0 g | 0.1 g | 0.4 g | 0.1 g | 4.0 g | 0.5 g | 0.1 |
| 20 | 5.0 g | 2.0 g | 0.1 g | 0.4 g | 0.1 g | 4.0 g | 10 g | 2 |

TABLE 5-continued

| | INORGANIC COMPONENT | ORGANIC COMPONENT | | | | | ADDITIVE (PENTAMETHYLENE) GLYCOL | |
|---|---|---|---|---|---|---|---|---|
| EX- AMPLE | POWDERED GLASS | ORGANIC BINDER | MONOMER | POLYMERIZATION INITIATOR A | POLYMERIZATION INITIATOR B | ORGANIC SOLVENT | AMOUNT | RATIO |
| 21 | 5.0 g | 2.0 g | 0.1 g | 0.4 g | 0.1 g | 4.0 g | 25 g | 5 |
| 22 | 5.0 g | 2.0 g | 0.1 g | 0.4 g | 0.1 g | 4.0 g | 26 g | 5.2 |

The formation of pattern having via a hole 50 μm in diameter was performed using the photosensitive insulating pastes of the examples 17 to 22 in a manner equivalent to that in the example 1. The storage stabilities and the coating properties of these pastes were also evaluated in a manner equivalent to those in the examples 11 to 16. The results are shown in Table 6 below.

TABLE 6

| | STORAGE STABILITIES | | | | | COATING PROPERTIES OF PASTE |
|---|---|---|---|---|---|---|
| EX- AM- PLE | IMME- DIATELY PREPA- RATION | AFTER 1 DAY | AFTER 3 DAYS | AFTER 1 WEEK | AFTER 1 MONTH | |
| 17 | ◯ | ◯ | ◯ | Δ | Δ | ◯ |
| 18 | ◯ | ◯ | ◯ | ◯ | Δ | ◯ |
| 19 | ◯ | ◯ | ◯ | ◯ | ◯ | ◯ |
| 20 | ◯ | ◯ | ◯ | ◯ | ◯ | ◯ |
| 21 | ◯ | ◯ | ◯ | ◯ | ◯ | ◯ |
| 22 | ◯ | ◯ | ◯ | ◯ | ◯ | Δ |

As can be seen from Table 6, the photosensitive insulating pastes of the examples 19 to 21 in which the ratios by weight of the amounts of pentamethylene glycol added were from 0.1 to 5 to the powdered glass in the photosensitive insulating pastes had superior storage stabilities. In addition, the non-exposed areas of the films of the compositions described above easily dissolved in the developing solution, and hence, via holes having superior shapes could be obtained.

In contrast, when the amount of the pentamethylene glycol added was small, as were the cases with the photosensitive insulating pastes of the examples 17 and 18, the formation of the coating film could be performed 1 week or 1 month after the preparation of the paste, but since the non-exposed areas thereof were difficult to dissolve in the developing solution, the pattern formation tended to be difficult. In addition, when the amount of the pentamethylene glycol added was excessive, as was the case with the photosensitive insulating paste of the example 22, the storage stabilities thereof was superior; however, since the viscosity thereof was excessively decreased, the coating properties tended to deteriorate to some extent.

As described above, when the photosensitive insulating composition contains at least one of a 2 to 6 hydroxy group containing alcohol at a predetermined amount, which was formed by mixing the photosensitive organic component containing the organic binder having an acidic functional group and the powdered inorganic material containing a polyvalent metal oxide, the gelation of the paste was satisfactory prevented in both cases in which the composition was a paste before coating and was a film after coating and drying, and hence, fine via holes could be formed with a higher degree of accuracy. In particular, the stabilities of the coating film were superior, and the development thereof could be reliably performed by a photolithographic method.

Photosensitive Conductive Paste

Example 1

After mixing the components in the amounts shown below, the mixture was kneaded by a three-roll mill, thereby yielding a photosensitive conductive paste.

Organic binder: a copolymer of methacrylic acid and methyl methacrylate in a ratio by weight of 25 to 75 (the mean weight average molecular weight was 50,000), 200.0 g Inorganic component: $SiO_2$—$PbO$—$B_2O_3$-based powdered glass (the content of boric acid was 17%, the average particle diameter was 3 μm), 90.0 g Conductive metal component: powdered copper (the average particle diameter was 3 μm), 1,500.0 g Monomer having a reactive functional group: trimethylolpropane triacrylate, 100.0 g Photopolymerization initiator: 2-methyl-1-[4-(methylthio)phenyl]-2-morpholinopropane-1-one, 40.0 g Photopolymerization initiator: 2,4-diethyl thioxanthone, 10.0 g Organic solvent: ethyl carbitol acetate, 400.0 g Hexahydroxy alcohol: glucitol, 10.0 g Next, the photosensitive conductive paste of this example was coated on an insulating substrate composed of alumina by spin coating and was then dried at 100° C. for 1 hour, thereby forming a coating film 20 μm thick. Subsequently, after the coating film thus formed was held for 24 hours, an exposing process was preformed. The exposing process was performed by irradiating light of a high pressure mercury lamp at an amount of exposure of 250 mj/cm² via a patterned mask having a line (L) 20 μm wide and a space (S) 20 μm wide, i.e., L/S=20/20 (μm). Subsequently, development was performed by using an aqueous solution of sodium carbonate, thereby forming a pattern having an L of 20 μm wide and an S of 20 μm wide, i.e., L/S=20/20 (μm). After degreasing was performed, the pattern formed on the insulating layer was baked at 900° C. in a $N_2$ atmosphere, thereby forming a conductive pattern composed of copper having an L 10 μm wide and an S 30 μm wide, i.e., L/S 10/30 (μm).

Examples 2 to 11

In a manner equivalent to that described in the example 1, photosensitive conductive pastes having compositions shown in Table 7 below were prepared. In these examples, pentamethylene glycol of example 2 is a dihydroxy alcohol, glycerin of example 3 is a trihydroxy alcohol, erythritol of example 4 is a tetrahydroxy alcohol, xylitol of example 5 is a pentahydroxy alcohol, and mannitol of example 6 is a hexahydroxy alcohol. In addition, 3-methoxy-3-methyl butanol of example 7 is a monohydroxy alcohol.

TABLE 7

| | INORGANIC COMPONENT | | ORGANIC COMPONENT | | | | | | |
|---|---|---|---|---|---|---|---|---|---|
| | POWDERED | POWDERED | | | POLYMERIZATION | POLYMERIZATION | | ADDITIVE | |
| EXAMPLE | GLASS | COPPER | ORGANIC BINDER | MONOMER | INITIATOR A | INITIATOR B | ORGANIC SOLVENT | AMOUNT | TYPE |
| 1 | 90.0 g | 1500.0 g | 200.0 g | 100.0 g | 40.0 g | 10.0 g | 400.0 g | 10.0 g | GLUCITOL |
| 2 | 90.0 g | 1500.0 g | 200.0 g | 100.0 g | 40.0 g | 10.0 g | 400.0 g | 10.0 g | PENTAMETHYLENE GLYCOL |
| 3 | 90.0 g | 1500.0 g | 200.0 g | 100.0 g | 40.0 g | 10.0 g | 400.0 g | 10.0 g | GLYCERIN |
| 4 | 90.0 g | 1500.0 g | 200.0 g | 100.0 g | 40.0 g | 10.0 g | 400.0 g | 1.0 g | ERYTHRITOL |
| 5 | 90.0 g | 1500.0 g | 200.0 g | 100.0 g | 40.0 g | 10.0 g | 400.0 g | 1.0 g | XYLITOL |
| 6 | 90.0 g | 1500.0 g | 200.0 g | 100.0 g | 40.0 g | 10.0 g | 400.0 g | 1.0 g | MANNITOL |
| 7 | 90.0 g | 1500.0 g | 200.0 g | 100.0 g | 40.0 g | 10.0 g | 400.0 g | 10.0 g | 3-METHOXY-3-METHYL BUTANOL |
| 8 | 90.0 g | 1500.0 g | 200.0 g | 100.0 g | 40.0 g | 10.0 g | 400.0 g | 0 g | — |
| 9 | 90.0 g | 1500.0 g | 200.0 g | 100.0 g | 40.0 g | 10.0 g | 400.0 g | 10.0 g | PHOSPHORIC ACID |
| 10 | 90.0 g | 1500.0 g | 200.0 g | 100.0 g | 40.0 g | 10.0 g | 400.0 g | 2.0 g | BENZOTRIAZOLE |
| 11 | 90.0 g | 1500.0 g | 200.0 g | 100.0 g | 40.0 g | 10.0 g | 400.0 g | 10.0 g | ACETIC ACID |

The storage conditions (storage stabilities) of the photosensitive conductive pastes of the examples 1 to 11 were evaluated at 20° C. or less in the air immediately after the preparations thereof and were also evaluated after 1 day, 3 days, 1 week and 1 month. The photosensitive conductive pastes were stored at 20° C. or less in the air. The results are shown in Table 8 below. In Table 8, "○" indicates that the photosensitive conductive paste was not gelled and was in a state in which the coating could be performed. In addition, "x" in the table indicates that the photosensitive conductive paste was gelled and was in a state in which the coating could not be performed.

TABLE 8

| | | STORAGE STABILITIES | | | | |
|---|---|---|---|---|---|---|
| EXAMPLE | ADDITIVE | IMMEDIATELY AFTER PREPARATION | AFTER 1 DAY | AFTER 3 DAYS | AFTER 1 WEEK | AFTER 1 MONTH |
| 1 | GLUCITOL | ○ | ○ | ○ | ○ | ○ |
| 2 | PENTAMETHYLENE GLYCOL | ○ | ○ | ○ | ○ | ○ |
| 3 | GLYCERIN | ○ | ○ | ○ | ○ | ○ |
| 4 | ERYTHRITOL | ○ | ○ | ○ | ○ | ○ |
| 5 | XYLITOL | ○ | ○ | ○ | ○ | ○ |
| 6 | MANNITOL | ○ | ○ | ○ | ○ | ○ |
| 7 | 3-METHOXY-3-METHYL BUTANOL | ○ | ○ | ○ | ○ | ○ |
| 8 | — | ○ | x | x | x | x |
| 9 | PHOSPHORIC ACID | ○ | x | x | x | x |
| 10 | BENZOTRIAZOLE | ○ | x | x | x | x |
| 11 | ACETIC ACID | ○ | x | x | x | x |

As can be seen from Table 8, the photosensitive conductive pastes containing polyhydroxy alcohols of the examples 1 to 6 were not gelled at all predetermined times for evaluation. That is, immediately after the preparations of the pastes and after 1 day, 3 days, 1 week and 1 month, the coating could be performed on the insulating substrate by spin coating, and the patterning could also be reliably performed by a photolithographic method.

In contrast, the photosensitive conductive pastes containing no polyhydroxy alcohols at all or containing additives (anti-gelling agents) other than polyhydroxy alcohols, as were the cases with the examples 8 to 11, the pastes were not gelled immediately after the preparations thereof and exhibited superior stabilities; however, the gelation occurred concomitant with the passage of time.

The photosensitive conductive paste containing 3-methoxy-3-methyl butanol, example 7, was not gelled immediately after the preparation thereof and after 1 day, 3 days, 1 week and 1 month, and the composition could be reliably coated on the insulating substrate by spin coating; however, after the coating film was dried, the non-exposed areas thereof did not dissolve in the developing solution in an exposing process, and hence, the pattern formation could not be performed.

Example 12

After mixing the components in the amounts shown below, the mixture was kneaded by a three-roll mill, thereby yielding a photosensitive conductive paste.

Organic binder: a copolymer of methacrylic acid and methyl methacrylate in a ratio by weight of 25 to 75 (the mean weight average molecular weight was 50,000), 200.0 g Inorganic component: $SiO_2$—PbO—$B_2O_3$-based powdered glass (the content of boric acid was 17%, the average particle diameter was 3 μm), 90.0 g Conductive metal component: powdered silver (the average particle diameter was 3 μm), 1,000.0 g Monomer having a reactive functional group: trimethylolpropane triacrylate, 100.0 g Photopolymerization initiator: 2-methyl-1-[4-(methylthio)phenyl]-2-morpholinopropane-1-one, 40.0 g Photopolymerization initiator: 2,4-diethyl thioxanthone, 10.0 g Organic solvent: ethyl carbitol acetate, 400.0 g Hexahydroxy alcohol: glucitol, 10.0 g Next, the photosensitive conductive paste having the composition described above of this example was coated on an insulating substrate composed of alumina by spin coating and was then dried at 100° C. for 1 hour, thereby forming a coating film 20 μm thick. After the coating film thus formed was held for 24 hours, an exposing process was preformed. The exposing process was performed by irradiating light of a high pressure mercury lamp at an amount of exposure of 250 mj/cm$^2$ via a patterned mask having a line (L) 20 μm wide and a space (S) 20 μm wide, i.e., L/S=20/20 (μm). Subsequently, development was performed by using an aqueous solution of sodium carbonate, thereby forming a pattern having an L 20 μm wide and an S 20 μm wide, i.e., L/S=20/20 (μm). The pattern formed on the insulating layer was then baked at 850° C. in an Ar atmosphere, thereby forming a conductive pattern composed of silver having an L 10 μm wide and an S 30 μm wide, i.e., L/S=10/30 (μm).

Examples 13 to 22

In a manner equivalent to that described in the example 12, photosensitive conductive pastes having compositions shown in Table 9 below were prepared. In these examples, pentamethylene glycol of example 13 is a dihydroxy alcohol, glycerin of example 14 is a trihydroxy alcohol, erythritol of example 15 is a tetrahydroxy alcohol, xylitol of example 16 is a pentahydroxy alcohol, and mannitol of example 17 is a hexahydroxy alcohol. In addition, 3-methoxy-3-methyl butanol of example 18 is a monohydroxy alcohol.

TABLE 10

| | | STORAGE STABILITIES | | | | |
|---|---|---|---|---|---|---|
| EXAMPLE | ADDITIVE | IMMEDIATELY AFTER PREPARATION | AFTER 1 DAY | AFTER 3 DAYS | AFTER 1 WEEK | AFTER 1 MONTH |
| 12 | GLUCITOL | ○ | ○ | ○ | ○ | ○ |
| 13 | PENTAMETHYLENE GLYCOL | ○ | ○ | ○ | ○ | ○ |
| 14 | GLYCERIN | ○ | ○ | ○ | ○ | ○ |
| 15 | ERYTHRITOL | ○ | ○ | ○ | ○ | ○ |
| 16 | XYLITOL | ○ | ○ | ○ | ○ | ○ |
| 17 | MANNITOL | ○ | ○ | ○ | ○ | ○ |
| 18 | 3-METHOXY-3-METHYL BUTANOL | ○ | ○ | ○ | ○ | ○ |
| 19 | — | ○ | x | x | x | x |
| 20 | PHOSPHORIC ACID | ○ | x | x | x | x |
| 21 | BENZOTRIAZOLE | ○ | x | x | x | x |
| 22 | ACETIC ACID | ○ | x | x | x | x |

As can be seen from Table 10, the photosensitive conductive pastes containing polyhydroxy alcohols of the examples 12 to 17 were not gelled at all predetermined times for evaluation. That is, immediately after the preparations thereof and after 1 day, 3 days, 1 week and 1 month, the

TABLE 9

| | INORGANIC COMPONENT | | ORGANIC COMPONENT | | | | | | |
|---|---|---|---|---|---|---|---|---|---|
| EXAMPLE | POWDERED GLASS | POWDERED SILVER | ORGANIC BINDER | MONOMER | POLYMERIZATION INITIATOR A | POLYMERIZATION INITIATOR B | ORGANIC SOLVENT | ADDITIVE AMOUNT | ADDITIVE TYPE |
| 12 | 90.0 g | 1000.0 g | 200.0 g | 100.0 g | 40.0 g | 10.0 g | 400.0 g | 10.0 g | GLUCITOL |
| 13 | 90.0 g | 1000.0 g | 200.0 g | 100.0 g | 40.0 g | 10.0 g | 400.0 g | 10.0 g | PENTAMETHYLENE GLYCOL |
| 14 | 90.0 g | 1000.0 g | 200.0 g | 100.0 g | 40.0 g | 10.0 g | 400.0 g | 10.0 g | GLYCERIN |
| 15 | 90.0 g | 1000.0 g | 200.0 g | 100.0 g | 40.0 g | 10.0 g | 400.0 g | 1.0 g | ERYTHRITOL |
| 16 | 90.0 g | 1000.0 g | 200.0 g | 100.0 g | 40.0 g | 10.0 g | 400.0 g | 1.0 g | XYLITOL |
| 17 | 90.0 g | 1000.0 g | 200.0 g | 100.0 g | 40.0 g | 10.0 g | 400.0 g | 1.0 g | MANNITOL |
| 18 | 90.0 g | 1000.0 g | 200.0 g | 100.0 g | 40.0 g | 10.0 g | 400.0 g | 10.0 g | 3-METHOXY-3-METHYL BUTANOL |
| 19 | 90.0 g | 1000.0 g | 200.0 g | 100.0 g | 40.0 g | 10.0 g | 400.0 g | 0 g | — |
| 20 | 90.0 g | 1000.0 g | 200.0 g | 100.0 g | 40.0 g | 10.0 g | 400.0 g | 10.0 g | PHOSPHORIC ACID |
| 21 | 90.0 g | 1000.0 g | 200.0 g | 100.0 g | 40.0 g | 10.0 g | 400.0 g | 2.0 g | BENZOTRIAZOLE |
| 22 | 90.0 g | 1000.0 g | 200.0 g | 100.0 g | 40.0 g | 10.0 g | 400.0 g | 10.0 g | ACETIC ACID |

The storage conditions (storage stabilities) of the photosensitive conductive pastes of the examples 12 to 22 were evaluated at 20° C. or less in the air immediately after the preparations thereof and were also evaluated after 1 day, 3 days, 1 week and 1 month. The results are shown in Table 10 below. The photosensitive conductive pastes were stored at 20° C. or less in the air. In Table 10, "○" indicates that the photosensitive conductive paste was not gelled and was in a state in which the coating could be performed. In addition, "x" in the table indicates that the photosensitive conductive paste was gelled and was in a state in which the coating could not be performed.

coating could be performed on the insulating substrate by spin coating, and the patterning could also be reliably performed by a photolithographic method.

In contrast, the photosensitive conductive pastes containing no polyhydroxy alcohols at all or containing additives other than polyhydroxy alcohols, as were the cases with the examples 19 to 22, the pastes were not gelled immediately after the preparations thereof and exhibited superior stabilities; however, the gelation occurred concomitant with the passage of time.

The photosensitive conductive paste containing 3-methoxy-3-methyl butanol, example 18, was not gelled immediately after the preparation thereof and after 1 day, 3 days, 1 week and 1 month, and the photosensitive conductive paste could be reliably coated on the insulating substrate by spin coating; however, after the coating film was dried, the non-exposed areas thereof did not dissolve in the developing solution in an exposing process, and hence, the pattern formation could not be performed.

Using the photosensitive conductive pastes containing alcohols having at least two hydroxyl groups in one molecule, gelation could be sufficiently suppressed both when the composition was a paste before coating and was a film after drying and coating. Accordingly, the long term storage stabilities could be improved, and in addition, developing could be reliably performed by a lithographic method, whereby a fine and thick conductive pattern composed of copper or silver could be formed with a high degree of accuracy.

In addition, the adhesive strength of Ag conductive pattern to an insulating substrate was measured by forming a conductive pattern 2 mm×2 mm on the insulating substrate composed of alumina by predetermined treatments using the photosensitive conductive pastes of examples 12 to 17. In this measurement, the tensile strength was measured as the adhesive strength by Autograph (made by Shimazu Seisakusyo K.K.) using the conductive pattern 2 mm×2 mm provided with a U-shaped wire soldered thereon. All adhesive strengths of the photosensitive conductive pastes of the examples 12 to 17 were 19.6 N/2 mm×2 mm or more at room temperature.

In addition, a photosensitive conductive paste was prepared in a manner equivalent to that of the example 12 except that the powdered glass was not present. Using the paste described above, a conductive pattern 2 mm×2 mm was formed on an insulating substrate composed of alumina in a manner equivalent to that described above. The storage stabilities of this photosensitive conductive paste was equivalent to that of the example 12; however, the adhesive strength thereof was 0.98 N/2 mm×2 mm.

Using the photosensitive conductive paste containing powdered glass as an inorganic additive, the adhesive strength thereof to the insulating substrate composed of alumina used as an underlying layer could be improved, and hence, a highly reliable conductive pattern having a high strength could be formed.

Examples 23 to 26

A photosensitive conductive paste was prepared in a manner equivalent to that in the example 12 in which an amount of powdered silver was controlled so as to have the total volume fraction of the powdered silver and the powdered glass in accordance with that shown in Table 11. Subsequently, in a manner equivalent to that in the example 12, formation of a conductive pattern having an L of 10 μm wide and an S of 30 μm wide, i.e., L/S=10/30 (μm), was done on an insulating substrate composed of alumina.

The occurrence of wire breakage in baking was evaluated for the conductive patterns formed of the photosensitive conductive pastes of the examples 23 to 26. The results are shown in Table 11 below. In Table 11, "○" indicates that a conductive pattern was preferably formed which had no wire breakage during baking. In addition, "Δ" in the table indicates that at least one wire breakage in a line 1 cm long occurred during baking. In addition, "total volume fraction" in Table 11 below indicates that in the photosensitive conductive paste, {(volume of powdered silver)+(volume of powdered glass)}/{{(volume of powdered silver)+(volume of powdered glass)+(volume of organic binder)+(volume of monomer)+(volume of polymerization initiator)}, i.e., {(volume of powdered silver)+(volume of powdered glass)}/(volume of solid component of photosensitive conductive paste).

TABLE 11

| EXAMPLE | POWDERED SILVER | TOTAL VOLUME FRACTION | PATTERNING PROPERTIES |
|---|---|---|---|
| 23 | 924.3 g | 34% | ○ |
| 24 | 742.5 g | 30% | ○ |
| 25 | 700.2 g | 29% | Δ |
| 26 | 659.2 g | 28% | Δ |

As can be seen from Table 11, with the photosensitive conductive pastes of the examples 23 and 24 in which the total volume fraction of the powdered glass and powdered silver remaining after baking was 30% or more, the wire breakage did not occur during baking, and hence, a conductive pattern having a superior shape could be obtained.

Examples 27 to 29

A photosensitive conductive paste was prepared in a manner equivalent to that in the example 12, in which an amount of powdered silver was controlled so as to have the total volume fraction of the powdered silver and the powdered glass in accordance with that shown in Table. 12. Subsequently, as was the case with the example 12, formation of a conductive pattern having an L of 10 μm wide and an S of 30 μm wide, i.e., L/S=10/30 (μm), was done on an insulating substrate composed of alumina.

Development properties were evaluated for the conductive patterns formed of the photosensitive conductive pastes of the examples 27 to 29. The results are shown in Table 12 below. In Table 12, "○" indicates that the conductive pattern was preferably formed which had no film defects in developing. In addition, "Δ" in the table indicates that film defects occurred in developing. In addition, "total volume fraction" in Table 12 below indicates that in a photosensitive conductive paste, {(volume of powdered silver)+(volume of powdered glass)}/{{(volume of powdered silver)+(volume of powdered glass)+(volume of organic binder)+(volume of monomer)+(volume of polymerization initiator)}, i.e., {(volume of powdered silver)+(volume of powdered glass)}/(volume of solid component of photosensitive conductive paste).

TABLE 12

| EXAMPLE | POWDERED SILVER | TOTAL VOLUME FRACTION | PATTERNING PROPERTIES |
|---|---|---|---|
| 27 | 16833.4 g | 89% | ○ |
| 28 | 18742.5 g | 90% | Δ |
| 29 | 21075.8 g | 91% | Δ |

As can be seen from Table 12, with the photosensitive conductive paste of example 27 in which the total volume fraction of the powdered glass and powdered silver remaining after baking was 89% or less, no film defect occurred in developing, and hence, a conductive pattern having a superior shape could be obtained.

Examples 30 to 36

A photosensitive conductive paste was prepared in a manner equivalent to that in the example 1 by changing the amount of glucitol added as shown in Table 13 below.

Storage stabilities were evaluated for the photosensitive conductive pastes of the examples 30 to 36. The photosensitive conductive pastes were stored at 20° C. or less in the air. In addition, coating properties of the pastes were evaluated immediately after the preparation thereof. In this measurement, the photosensitive conductive paste was coated on an insulating substrate composed of alumina by spin coating. The coating properties were evaluated by the difference between the intended film thickness (15 μm) and the actual film thickness.

The results of the storage stabilities and the coating properties of the photosensitive conductive pastes of the examples 30 to 36 are shown in Table 13 below. Concerning the storage stabilities shown in Table 13, "○" indicates that the paste itself was not gelled and was in a state in which the coating could be performed, and "Δ" in the table indicates that a part of the paste was gelled. Concerning the coating properties of the paste shown in Table 13, "○" indicates that the difference between the intended and the actual film thicknesses was within ±0.5 μm, and "Δ" in the table indicates that the difference between the intended and the actual film thicknesses exceeded ±0.5 μm. In addition, "ratio" in Table 13 is a ratio by weight (percent by weight) of the glucitol to the powdered glass.

of examples 35 and 36 in which the ratios of the glucitol to the powdered glass exceeded about 20 percent by weight, the coating properties of the pastes were degraded.

Examples 37 to 44

A photosensitive conductive paste was prepared in a manner equivalent to that in the example 2 by changing the amount of pentamethylene glycol added as shown in Table 14 below. Pentamethylene glycol is a liquid dihydroxy alcohol at room temperature.

Storage stabilities were evaluated for the photosensitive conductive pastes of the examples 37 to 44. The photosensitive conductive pastes were stored at 20° C. or less in the air. In addition, coating properties of the pastes were evaluated immediately after the preparations thereof. In this measurement, the photosensitive conductive paste was coated on an insulating substrate composed of alumina by spin coating. The coating properties were evaluated by the difference between an intended film thickness (15 μm) and an actual film thickness.

The results of the storage stabilities and the coating properties of the photosensitive conductive pastes of the examples 37 to 44 are shown in Table 14 below. Concerning the storage stabilities in Table 14, "○" indicates that the

TABLE 13

| | GLUCITOL | | STORAGE STABILITIES | | | | | | COATING |
|---|---|---|---|---|---|---|---|---|---|
| EXAMPLE | AMOUNT | RATIO (PERCENT BY WEIGHT) | IMMEDIATELY AFTER PREPARATION | AFTER 1 DAY | AFTER 3 DAYS | AFTER 1 WEEK | AFTER 2 WEEK | AFTER 1 MONTH | PROPERTIES OF PASTE |
| 30 | 5 mg | 0.006 | ○ | ○ | ○ | ○ | ○ | Δ | ○ |
| 31 | 9 mg | 0.01 | ○ | ○ | ○ | ○ | ○ | ○ | ○ |
| 32 | 15 mg | 0.017 | ○ | ○ | ○ | ○ | ○ | ○ | ○ |
| 33 | 16.2 g | 18.0 | ○ | ○ | ○ | ○ | ○ | ○ | ○ |
| 34 | 18.0 g | 20.0 | ○ | ○ | ○ | ○ | ○ | ○ | ○ |
| 35 | 19.8 g | 22.0 | ○ | ○ | ○ | ○ | ○ | ○ | Δ |
| 36 | 21.6 g | 24.0 | ○ | ○ | ○ | ○ | ○ | ○ | Δ |

As can be seen from Table 13, with the photosensitive conductive pastes of examples 31 to 34 in which the ratios of the glucitol to the powdered glass were from 0.01 to 20 percent by weight, the gelation could be effectively prevented over 1 month after the preparations thereof, and the coating properties of the paste were also preferable. In contrast, with the photosensitive conductive paste of example 30 in which the ratio of the glucitol to the powdered glass was less than about 0.01 percent by weight, the gelation gradually occurred concomitant with the passage of time. In addition, with the photosensitive conductive pastes paste itself was not gelled and was in a state in which the coating could be performed, and "Δ" in the table indicates that a part of the paste was gelled. Concerning the coating properties of the paste in Table 14, "○" indicates that the difference between the intended and the actual film thicknesses was within ±0.5 μm, and "○" in the table indicates that the difference between the intended and the actual film thicknesses exceeded ±0.5 μm. In addition, "ratio" in Table 14 is a ratio by weight (percent by weight) of the pentamethylene glycol to the powdered glass.

TABLE 14

| | PENTAMETHYLENE GLYCOL | | STORAGE STABILITIES | | | | | | COATING |
|---|---|---|---|---|---|---|---|---|---|
| EXAMPLE | AMOUNT | RATIO | IMMEDIATELY AFTER PREPARATION | AFTER 1 DAY | AFTER 3 DAYS | AFTER 1 WEEK | AFTER 2 WEEK | AFTER 1 MONTH | PROPERTIES OF PASTE |
| 37 | 5.0 g | 0.056 | ○ | ○ | ○ | ○ | ○ | Δ | ○ |
| 38 | 7.0 g | 0.078 | ○ | ○ | ○ | ○ | ○ | Δ | ○ |
| 39 | 9.0 g | 0.010 | ○ | ○ | ○ | ○ | ○ | ○ | ○ |
| 40 | 11.0 g | 0.122 | ○ | ○ | ○ | ○ | ○ | ○ | ○ |
| 41 | 420 g | 4.667 | ○ | ○ | ○ | ○ | ○ | ○ | ○ |
| 42 | 450 g | 5.000 | ○ | ○ | ○ | ○ | ○ | ○ | ○ |

TABLE 14-continued

| | | | STORAGE STABILITIES | | | | | | |
|---|---|---|---|---|---|---|---|---|---|
| | PENTAMETHYLENE GLYCOL | | IMMEDIATELY AFTER | AFTER 1 | AFTER 3 | AFTER 1 | AFTER 2 | AFTER 1 | COATING PROPERTIES OF |
| EXAMPLE | AMOUNT | RATIO | PREPARATION | DAY | DAYS | WEEK | WEEK | MONTH | PASTE |
| 43 | 480 g | 5.333 | ○ | ○ | ○ | ○ | ○ | ○ | Δ |
| 44 | 510 g | 5.667 | ○ | ○ | ○ | ○ | ○ | ○ | Δ |

As can be seen from Table 14, with the photosensitive conductive pastes of examples 39 to 42 in which the ratios by weight of the pentamethylene glycol to the powdered glass were from about 0.1 to 5, the gelation could be effectively prevented over 1 month after the preparations thereof, and the coating properties of the pastes were also preferable. In contrast, with the photosensitive conductive pastes of examples 37 and 38 in which the ratios by weight of the pentamethylene glycol to the powdered glass was less than about 0.1, gelation gradually occurred concomitant with the passage of time. In addition, with the photosensitive conductive pastes of examples 43 and 44 in which the ratios by weight of the pentamethylene glycol to the powdered glass exceeded about 5, the coating properties of the pastes were degraded.

Example 45

A slurry was obtained by mixing 37.3 g of powdered borosilicate glass, 24.9 g of powdered alumina, 6.2 g of a copolymer of methacrylic acid and methyl methacrylate in a ratio by weight of 25 to 75 having a mean weight average molecular weight of 50,000, 3.1 g of ethyl alcohol and 0.5 g of dipropylene glycol monomethyl ether. The slurry thus formed was molded into a sheet by a doctor blade method, and the sheet was dried at 100° C. for 1 hour, whereby a ceramic green sheet 30 μm thick was obtained.

Next, by using the photosensitive conductive paste of the example 23, a conductive pattern having an L of 20 μm wide and an S of 20 μm wide, i.e., L/S=20/20 (μm), was formed on a polyethylene terephthalate (PET) film in a manner equivalent to that in the example 23. Subsequently, the PET film thus formed was laminated on the ceramic green sheet described above, and the laminate was hot-pressed at a pressure of 10 MPa and at a temperature of 60° C. for 1 minute, and the conductive pattern on the PET film was then thermal-transferred on the green sheet by separating the PET film from the laminate. The green sheet thus formed was baked at 900° C. in the air, whereby a ceramic substrate could be obtained provided with a pattern having an L of 10 μm and an S of 30 mm, i.e., L/S=10/30 (μm).

Example 46

In a manner equivalent to that in the example 45, five green sheets provided with patterns thereon were formed. Next, these green sheets were laminated with each other and were hot-pressed at a pressure of 200 MPa and at a temperature of 60° C. for 1 minute. Subsequently, the laminate thus formed was baked at 900° C. in the air, whereby a multilayer ceramic substrate could be obtained provided with a pattern having an L of 10 μm and an S of 30 μm, i.e., L/S 10/30 (μm).

Example 47

In a manner equivalent to that in the example 45, conductive patterns were formed on PET films, and subsequently, a slurry similar to that in the example 45 was coated on the PET films by the doctor blade method. The films provided with the slurry thereon were dried at 50° C. for 1 hour and were then hot-pressed at a pressure of 10 MPa and at a temperature of 60° C. for 1 minute. Next, the PET films were separated, thereby forming ceramic green sheets provided with the conductive patterns. Next, a predetermined number of the ceramic green sheets was laminated with each other and was then baked at 900° C. in the air, whereby a multilayer ceramic substrate could be obtained provided with a pattern having an L of 10 μm and an S of 30 μm, i.e., L/S=10/30 (μm).

What is claimed is:

1. A photosensitive thick film composition comprising:
   a photosensitive organic component comprising an organic binder having an acidic functional group;
   an inorganic component comprising a polyvalent metal compound; and
   a polyhydroxy alcohol having a plurality of hydroxyl groups.

2. A photosensitive thick film composition according to claim 1, wherein the inorganic component is an insulating material, a dielectric material or a magnetic material.

3. A photosensitive thick film composition according to claim 2, wherein the inorganic component comprises at least one of powdered glass and powdered ceramic.

4. A photosensitive thick film composition according to claim 1, wherein the polyhydroxy alcohol has two to about six hydroxyl groups.

5. A photosensitive thick film composition according to claim 4, wherein the polyhydroxy alcohol is selected from the group consisting of glucitol, pentamethylene glycol, glycerin, erythritol, xylitol and mannitol.

6. A photosensitive thick film composition according to claim 1, wherein the polyhydroxy alcohol is liquid at room temperature and is present in a ratio of from about 0.1 to 5 parts by weight per part of the inorganic component.

7. A photosensitive thick film composition according to claim 1, wherein the polyhydroxy alcohol is solid at room temperature and is present at about 0.01 to 20 percent by weight of the total of the polyhydroxy alcohol and the inorganic component.

8. A photosensitive thick film composition according to claim 1, wherein the polyvalent metal is at least one member selected from the group consisting of boron, lead, zinc, bismuth, aluminum, magnesium, calcium, barium, titanium, strontium, zirconium, manganese, cobalt, nickel, iron, yttrium, niobium, lanthanum and ruthenium.

9. A photosensitive thick film composition according to claim 1, wherein the organic binder is an acrylic copolymer having carboxyl groups on side chains.

10. A photosensitive thick film composition according to claim 1, wherein the inorganic component occupies a volume fraction of about 30 to 90% based on the solid content of the photosensitive thick film composition.

11. A photosensitive thick film composition according to claim 10, wherein the polyhydroxy alcohol has two to about six hydroxyl groups and a boiling point of at least about 178° C.; the inorganic component comprises at least one of powdered glass and powdered ceramic; the polyvalent metal is at least one member selected from the group consisting of boron, lead, zinc, bismuth, aluminum, magnesium, calcium, barium, titanium, strontium, zirconium, manganese, cobalt, nickel, iron, yttrium, niobium, lanthanum and ruthenium; and wherein the organic binder is an acrylic copolymer having carboxyl groups on side chains.

12. A photosensitive thick film composition according to claim 1, further comprising a conductive metal.

13. A photosensitive thick film composition according to claim 12, wherein the conductive metal component is at least one powdered conductive metal selected from the group consisting of gold, silver, copper, platinum, aluminum, palladium, nickel, molybdenum and tungsten.

14. A photosensitive thick film composition according to claim 12, wherein the total of the conductive metal component and the inorganic component occupies a volume fraction of about 30 to 89% based on the solid content of the photosensitive thick film composition and wherein the conductive metal is about 30 to 95 weight % of the combination of the conductive metal component and the inorganic component.

15. An electronic device comprising the combination of:

a substrate; and a conductive pattern comprising a baked photosensitive thick film composition according to claim 12.

16. An electronic device according to claim 15, further comprising a plurality of layers on the substrate at least one of which has a via hole therein.

17. An electronic device comprising:

a substrate; and a functioning layer on the substrate comprising a baked photosensitive thick film composition according to claim 2.

18. An electronic device according to claim 17, wherein the functioning layer is an insulating layer, a dielectric layer or a magnetic layer, and has a via hole therein.

19. An electronic device comprising:

a substrate; and a functioning layer on the substrate comprising a baked photosensitive thick film composition according to claim 1.

20. An electronic device according to claim 19, wherein the functioning layer is an insulating layer, a dielectric layer or a magnetic layer, and has a via hole therein.

* * * * *